United States Patent
Fautz

(10) Patent No.: US 10,036,795 B2
(45) Date of Patent: Jul. 31, 2018

(54) METHOD FOR THE ADJUSTMENT OF AT LEAST ONE MAGNETIC RESONANCE IMAGE DATA SET OF A MOVABLE EXAMINATION OBJECT AND CORRESPONDINGLY DESIGNED MAGNETIC RESONANCE DEVICE

(71) Applicant: SIEMENS AKTIENGESELLSCHAFT, München (DE)

(72) Inventor: Hans-Peter Fautz, Forchheim (DE)

(73) Assignee: SIEMENS AKTIENGESELLSCHAFT (DE)

( * ) Notice: Subject to any disclaimer, the term of this patent is extended or adjusted under 35 U.S.C. 154(b) by 1158 days.

(21) Appl. No.: 14/220,456

(22) Filed: Mar. 20, 2014

(65) Prior Publication Data
US 2014/0292331 A1 Oct. 2, 2014

(30) Foreign Application Priority Data
Mar. 27, 2013 (DE) .................. 10 2013 205 402

(51) Int. Cl.
*G01R 33/565* (2006.01)
*G01R 33/58* (2006.01)

(52) U.S. Cl.
CPC ....... *G01R 33/56509* (2013.01); *G01R 33/58* (2013.01)

(58) Field of Classification Search
CPC .......................... G01R 33/58; G01R 33/56509
See application file for complete search history.

(56) References Cited

U.S. PATENT DOCUMENTS 5,931,781 A * 8/1999 De Boer .......... G01R 33/56325
324/318
6,068,595 A 5/2000 Miyazaki
(Continued)

FOREIGN PATENT DOCUMENTS

| CN | 101190128 A | 6/2008 |
| CN | 101281242 A | 10/2008 |

(Continued)

OTHER PUBLICATIONS

German Search Report [DE] Application No. 102013205402.5; dated Nov. 26, 2013; Siemens Aktiengesellschaft (13 pages).
(Continued)

*Primary Examiner* — Dixomara Vargas
(74) *Attorney, Agent, or Firm* — Schmeiser Olsen & Watts LLP

(57) ABSTRACT

A method for the adjustment of at least one magnetic resonance image data set of a movable examination object and correspondingly designed magnetic resonance device is provided. Moreover, a method, a computer program product and a computer-readable storage medium for the adjustment by a magnetic resonance device of at least one magnetic resonance image data set of a movable examination object is provided. After capturing two different types of position data for determination of the position of the examination object using navigator measurements and with the help of external markers, recording parameters and/or reconstruction parameters for recording and/or reconstruction of the at least one magnetic resonance image data set are adjusted as a function of the first and/or the second position data.

8 Claims, 2 Drawing Sheets

(56) References Cited

U.S. PATENT DOCUMENTS

Figure 1:
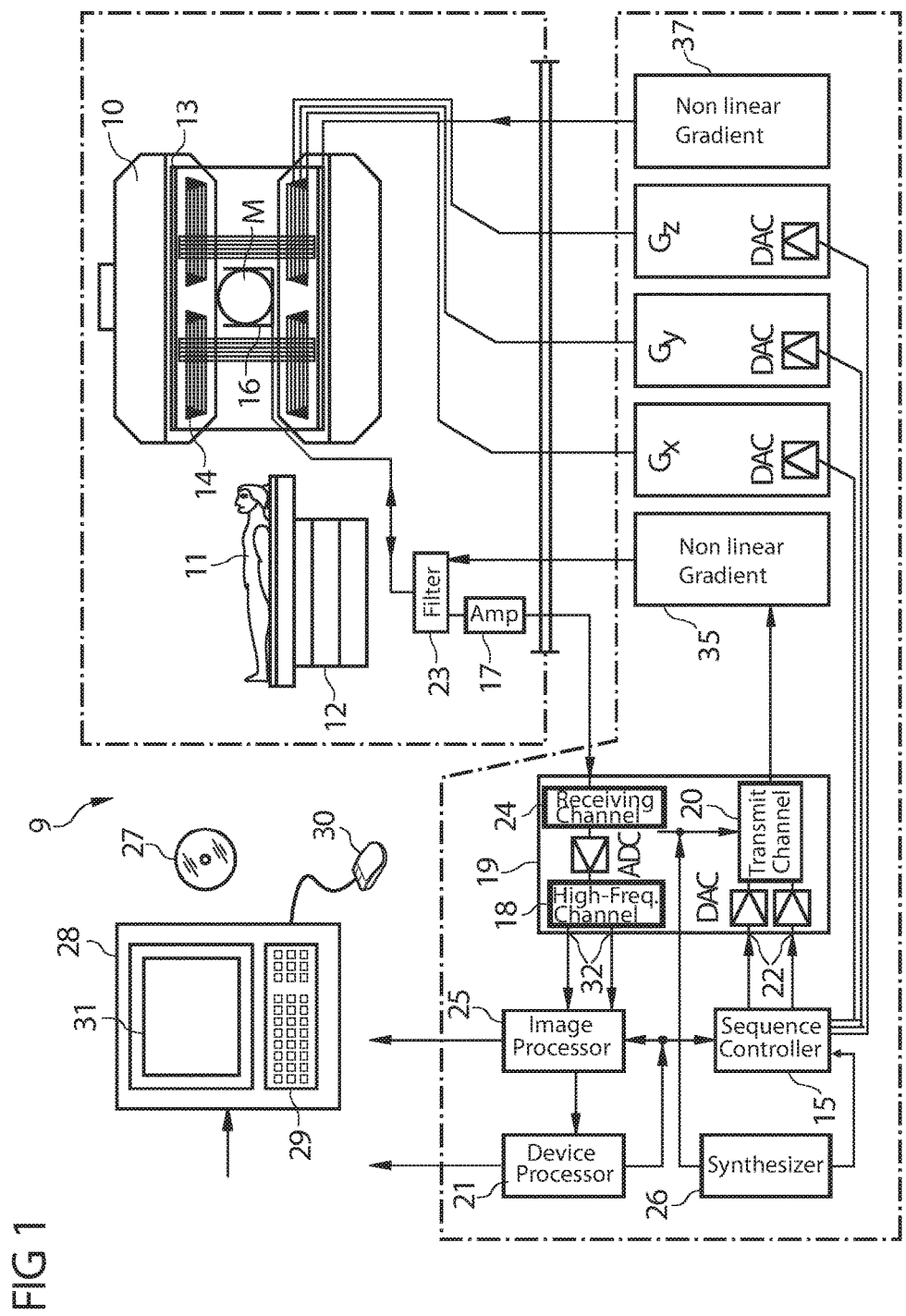

| | | | |
|---|---|---|---|
| 6,184,682 B1* | 2/2001 | Ehman | G06T 5/003 |
| | | | 324/300 |
| 6,541,970 B1* | 4/2003 | Takizawa | G01R 33/56554 |
| | | | 324/309 |
| 7,239,138 B2 | 7/2007 | Smink | |
| 8,705,829 B2* | 4/2014 | Frank | A61B 6/4441 |
| | | | 382/131 |
| 2008/0129290 A1 | 6/2008 | Yao | |
| 2008/0137930 A1 | 6/2008 | Rosen | |
| 2008/0214923 A1 | 9/2008 | Krueger et al. | |
| 2008/0317315 A1 | 12/2008 | Stemmer | |

FOREIGN PATENT DOCUMENTS

| | | |
|---|---|---|
| CN | 101329389 A | 12/2008 |
| EP | 1139114 A2 | 10/2001 |

OTHER PUBLICATIONS

Korean Office Action for Korean Application No. 2013P01332, dated Nov. 13, 2015.
Chinese Office Action and the English translation for Chinese Application No. 2014100941611, dated Dec. 19, 2016.

* cited by examiner

METHOD FOR THE ADJUSTMENT OF AT LEAST ONE MAGNETIC RESONANCE IMAGE DATA SET OF A MOVABLE EXAMINATION OBJECT AND CORRESPONDINGLY DESIGNED MAGNETIC RESONANCE DEVICE

CROSS-REFERENCE TO RELATED APPLICATIONS

This application claims priority to German Patent Application No. 102013205402.5, having a filing date of Mar. 27, 2013, the entire contents of which are hereby incorporated by reference.

FIELD OF TECHNOLOGY

The following relates to a method for the adjustment by a magnetic resonance device of at least one magnetic resonance image data set of a movable examination object, a corresponding computer program product which permits the performance of such a method, an electronically readable data carrier and a magnetic resonance device therefor.

BACKGROUND

Magnetic resonance tomography (MRT) is an imaging method which permits the high-resolution generation of sectional images of living organisms, such as human beings. The patient is positioned in a homogeneous magnetic field $B_0$. Gradient coils are used to modify the external magnetic field in the FOV (field of view) such that firstly a body layer is selected and secondly position encoding of the magnetic resonance (MR) signals generated is effected. In the subsequent reconstruction of the MR signals, for example, by Fourier transformation, an image is produced of the selected layer, which is used for medical diagnostics. The MR signals are generated and detected using a high-frequency system which comprises a transmitting antenna which radiates high-frequency (HF) excitation pulses into the patient, and a receiving antenna which detects the emitted HF resonance signals and forwards them for image reconstruction. By selecting a suitable pulse sequence, such as a spin echo sequence or a gradient echo sequence, and the associated sequence parameters, the contrast of the MR images can be diversely varied depending on the diagnostic task. The MRT maps body structures and accordingly represents a structural imaging method.

Movements during an MR recording, for example respiratory movements of a patient who is to be examined using MR, can in magnetic resonance imaging, especially during an examination of the organs of the thorax and of the abdomen, particularly of examination areas affected by the respiratory movement of the patient, result in artifacts, such as ghosting, blurring and/or a loss of intensity in the images generated for example and in registration errors between images generated. These artifacts may make it more difficult to base a diagnosis on these images, e.g. on the part of a physician, with the result that e.g. lesions may be overlooked.

Numerous techniques exist in the prior art for reducing artifacts caused by, for example, a respiratory movement. One of these techniques is to trigger a trigger signal for capturing magnetic resonance image data as a function of a respiratory movement or generally what is known as respiratory gating. Respiratory gating is a technique in which during the MR measurement, the patient's breathing is captured and is assigned to the measurement data acquired. In respiratory gating, the measurement data is only used for reconstruction if the respiratory movement captured meets certain pre-definable criteria.

The patient's breathing can in this case be detected using external sensors, e.g. a pneumatic cushion, or using MR signals, known as navigators. A navigator is generally a short sequence which acquires MR signals e.g. from the diaphragm or another signal source in the examination object, the movement of which is correlated with the patient's breathing. The respiratory movement can be traced by means of the position of the diaphragm or of the other signal source.

In respiratory gating using navigators, the navigator sequence is interleaved for example with the imaging sequence and a diaphragm position measured using a navigator is then assigned to the imaging data acquired immediately afterward (or beforehand).

A distinction is made between retrospective and prospective respiratory gating. In retrospective respiratory gating, the respiratory movement is captured and plotted during the MR measurement, but not analyzed. Instead the k space to be captured is measured several times. For reconstruction, only part of the measured data is used, preferably that part in which the respiratory signal lies in a particular window around a marked respiratory position. If a particular k space data point required for image reconstruction has been measured several times within the marked window, the data can be averaged. If however a data point has always been measured outside the window, the data point which deviates least from the marked position can be used for the reconstruction.

In prospective respiratory gating the physiological respiratory signal measured using a respiratory sensor (e.g. the diaphragm position measured using a navigator sequence) is analyzed during the measurement and the MR measurement is controlled on the basis of the physiological signal captured. In the simplest embodiment, known as the Acceptance/Rejection Algorithm (ARA), the measurement of an imaging data packet (and if appropriate the assigned navigator sequence) is repeated until the physiological signal falls in a predefined acceptance window.

SUMMARY

An aspect relates to a method for adjustment by a magnetic resonance device of at least one magnetic resonance image data set of a movable examination object.

Embodiments herein use the capture of two different types of position data to determine the position of the examination object, in order to adjust recording parameters and/or reconstruction parameters for recording and/or reconstruction of the at least one magnetic resonance image data set as a function of the first and/or the second position data.

Another aspect relates to a method for adjustment by a magnetic resonance device of at least one magnetic resonance image data set of a movable examination object, which comprises the following steps:

Capture of first position data of the examination object by means of a navigator measurement, Capture of second position data by means of external markers applied to the examination object, Capture by the magnetic resonance device of at least one magnetic resonance image data set and Adjustment of recording parameters and/or reconstruction parameters for recording and/or reconstruction of the at least one magnetic resonance image data set as a function of the first and/or the second position data.

Two fundamentally different approaches are combined with one another to determine the position of the examination object, the advantages of which can be gainfully used when adjusting recording parameters and/or reconstruction parameters and during image correction and/or image analysis. The capture of first position data by means of navigator measurements has the advantage that the data from a signal source in the examination object whose movement is for example correlated with the patient's breathing is acquired directly, whereas the capture of second position data by means of external markers applied to the examination object has the advantage that the position data can be continuously detected very accurately and independently of the MR recording. The combination of both approaches thus contributes to an increase in accuracy, in relation to both the determination of the position of the examination object, in particular a subregion of the examination object of relevance for the capture of magnetic resonance image data sets, as well as to the adjustment of recording parameters and/or reconstruction parameters and to a final artifact correction of the image data set.

In an exemplary embodiment, the second position data captured using external markers is aligned and/or checked for consistency by means of the first position data of the navigator measurement. In this way, it is possible to capture whether for example the marker normally applied to an external side of the examination object has moved in relation to a point in the interior of the examination object. For example, a marker applied to the skin of a patient may move in the opposite direction in relation to the skull and thus the brain of the patient, which would result in further artifacts in an image recording.

In an exemplary embodiment, the capture of the first position data is a function of information from the second position data. Because navigator measurements can be performed only at specific discrete time instants, and because this navigator measurement interrupts or at least disrupts the progress of an examination, it is advantageous if the information from the position capture by means of external markers can also be used to determine or trigger a particular measurement time instant of the navigator measurement. In this way, a smooth examination process can be ensured. The information from the second position data can also be used to calibrate the first position data capture.

In a further embodiment, the capture of the second position data is calibrated by means of the first position data of the navigator measurement. Similarly, as in the calibration of the first position data capture, the second position data capture can analogously also be calibrated by means of the first position data of the navigator measurement.

In an exemplary embodiment the adjustment of recording parameters and/or reconstruction parameters includes a readjustment of gradient parameters. Thus, movement artifacts can be corrected directly prospectively, before capture of the at least one magnetic resonance image data set.

In the context of the embodiments disclosed herein, a magnetic resonance device for correction of image data sets of a movable examination object is also provided. The magnetic resonance device here comprises a capture unit, a processing unit, a control device and an output unit and is designed to perform the following steps:

Capture by the capture unit of first position data of the examination object by means of a navigator measurement, Capture by the capture unit of second position data by means of external markers applied to the examination object, Capture by the capture unit of at least one magnetic resonance image data set, Adjustment by the processing unit of recording parameters and/or reconstruction parameters for recording and/or reconstruction of the at least one magnetic resonance image data set as a function of the first and/or the second position data.

Furthermore, embodiments include a computer program product, in particular a computer program or software, which can be loaded into a memory of a programmable controller or of an arithmetic unit of a magnetic resonance device. This computer program product can be used to execute all or various previously described embodiments of the method, if the computer program product runs in the controller or control device of the magnetic resonance device. The computer program product may in this case require program means, e.g. libraries and auxiliary functions, in order to implement the corresponding embodiments of the method. In other words, the computer program product is a computer program or software with which one of the above-described embodiments of the method can be executed or which executes this embodiment. The software involved may be a source code which still needs to be compiled and linked or else only interpreted, or an executable software code which in order to be executed only has to be loaded into the corresponding arithmetic unit.

Embodiments further relate to a computer-readable storage medium, e.g. a DVD, a magnetic tape or a USB stick, on which electronically readable control information, in particular software, is stored. If this control information is read from the data carrier and stored in a controller or arithmetic unit of a magnetic resonance device, all embodiments of the previously described method can be performed.

The advantages of the magnetic resonance device, of the computer program product and of the computer-readable storage medium essentially correspond to the advantages of the method, which are explained first of all in detail. Features, advantages or alternative embodiments mentioned here are likewise also to be transposed to the other subject matters claimed, and vice versa. In other words the concrete claims, which for example are directed at a device, can also be developed with the features which are described or claimed in connection with a method. The corresponding functional features of the method are in this case embodied by corresponding concrete modules, in particular by hardware modules.

BRIEF DESCRIPTION

Figure 2:
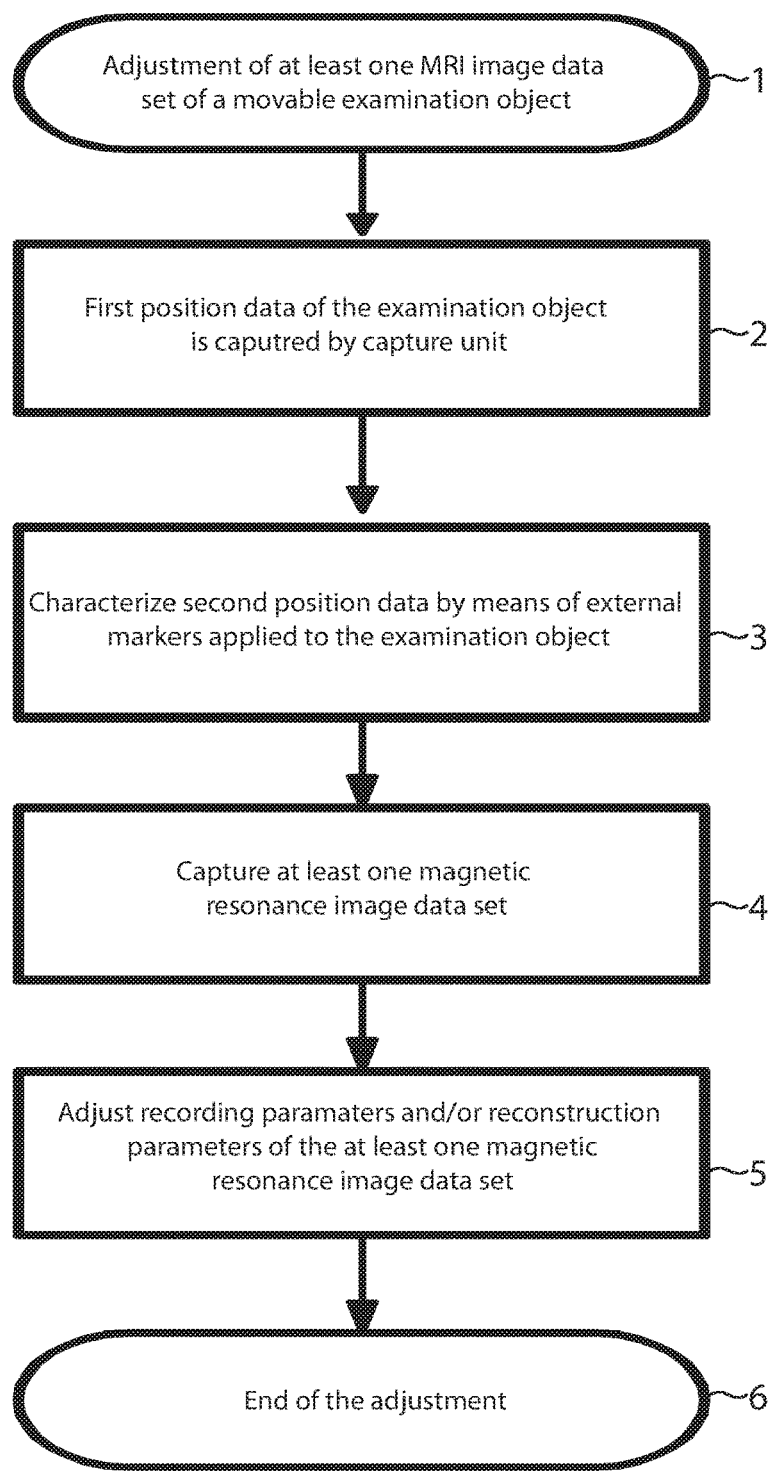

The invention is described and explained in greater detail below on the basis of the exemplary embodiments illustrated in the figures, wherein:

FIG. 1 a schematic illustration of an embodiment of a magnetic resonance device; and FIG. 2 a flow chart of an embodiment of a method.

DETAILED DESCRIPTION

FIG. 1 shows a schematic illustration of a magnetic resonance device 9 (a magnetic resonance imaging or nuclear spin tomography device). Here, a basic field magnet 10 of the magnetic resonance device 9 generates a temporally constant strong magnetic field for polarization or orientation of the nuclear spin in an examination region of an examination object 11, such as for example a part to be examined of a human body, which while lying on an examination table 12 is pushed into the magnetic resonance device 9 for the examination. The high level of homogeneity of the basic magnetic field 10 needed for the nuclear spin resonance measurement is defined in a typically spherical measurement volume M, into which the examination object 11 is pushed. To support the requirements for homogeneity and in particular to eliminate temporally invariable influences the magnetic resonance device comprises so-called shim sheet materials 9 made of ferromagnetic material at a suitable point. Temporally variable influences are eliminated by shim coils 13 if they are not desired. These are also used when generating nonlinear gradients 35, 37.

The basic field magnet 10 is likewise used as an enclosure for a cylindrical gradient field system 14 of the magnetic resonance device 9, which comprises three partial windings. Each partial winding is supplied by an amplifier 17 of the magnetic resonance device 9 with power for generating a linear (also temporally variable) gradient field in the respective direction of the Cartesian coordinates system. The first partial winding of the gradient field system 14 in this case generates a gradient $G_x$ in the x direction, the second partial winding a gradient $G_y$ in the y direction and the third partial winding a gradient $G_z$ in the z direction. Furthermore, thanks to the gradient field system 14, the nonlinear gradients 35, 37 are also generated. The amplifier 17 comprises a digital-to-analog converter DAC which is triggered by a sequence controller 15 of the magnetic resonance device 9 to generate properly timed gradient pulses.

The magnetic resonance device 9 further comprises at least one high-frequency antenna 16, which converts the high-frequency pulses emitted by a high-frequency power amplifier of the magnetic resonance device 9 into a magnetic alternating field for exciting the nuclei and orientation of the nuclear spin of the examination object 11 or of the region to be examined of the examination object 11. Each high-frequency antenna 16 consists of one or more HF transmitting coils and a plurality of HR receiving coils or HF receiving antennas in the form of an annular, preferably linear or matrix-shaped, arrangement of component coils. The HF receiving coils of the respective high-frequency antenna 16 also convert the alternating field emitted by the precessing nuclear spin, i.e. generally the nuclear spin echo signals produced by a pulse sequence comprising one or more high-frequency pulses and one or more gradient pulses, into a voltage (measurement signal) which is fed via the amplifier 17 to a high-frequency receiving channel 18 of a high-frequency system 19. The high-frequency system 19 of the magnetic resonance device 9 further comprises a transmitting channel 20 in which the high-frequency pulses are generated for the excitation of the magnetic nuclear resonance. In this case, the respective high-frequency pulses are represented digitally in the sequence controller 15 as a sequence of complex numbers on the basis of a pulse sequence defined by the device processor 21. This sequence of numbers is fed as a real and as an imaginary part via one input 22 in each case to a digital-to-analog converter DAC in the high-frequency system 19 and from there to a transmitting channel 20. In the transmitting channel 20, the pulse sequences are modulated up to a high-frequency carrier signal, whose basic frequency corresponds to the resonance frequency of the nuclear spin in the measurement volume.

The switch from transmitting to receiving mode is effected by a transmit/receive filter 23 of the magnetic resonance device 9. The HF transmitting coils of the high-frequency antenna 16 radiate the high-frequency pulses for exciting the nuclear spin into the measurement volume M and resulting echo signals are scanned via the HF receiving coils. The correspondingly obtained nuclear resonance signals are demodulated in the receiving channel 24, a first demodulator of the high-frequency system 19, on a phase-sensitive basis to an intermediate frequency and are digitized in the analog-to-digital converter ADC. This signal is still demodulated to the zero frequency. A demodulation to the zero frequency and the separation into real and imaginary parts takes place after digitization in the digital domain in a second demodulator 18 of the magnetic resonance device 9 which is connected to an output 32.

An image processor 25 of the magnetic resonance device 9 is used to reconstruct an MR image from the obtained measurement data. The administration of the measurement data, the image data, and the control programs is effected via the device processor or generally via a capture unit 21 of the magnetic resonance device 9. On the basis of a parameter containing control programs, the sequence controller 15 controls the generation of the respectively desired pulse sequences and the corresponding scanning of the k space. In particular, the sequence controller 15 in this case controls the properly timed switching of the gradients, the transmission of the high-frequency pulses with defined phase amplitude and the receipt of the nuclear resonance signals. The time basis for the high-frequency system 19 and the sequence controller 15 is provided by a synthesizer 26 of the magnetic resonance device 9. The selection of corresponding control programs for generating an MR image, which are stored for example on a data carrier 27, and the display of the generated MR image are effected via a terminal or generally via a processing unit 28 of the magnetic resonance device 9, which comprises a keyboard 29, a mouse 30 and an output unit, in this case a monitor 31.

FIG. 2 shows a flow chart of a method. The method comprises the method steps 1 to 6, wherein in the description of the method steps 1 to 6 parts of the description including the corresponding reference characters introduced in connection with FIG. 1 are used.

In method step 1, the adjustment of at least one magnetic resonance image data set of a movable examination object is started by a magnetic resonance device 9 and during method step 2 first position data of the examination object is captured by the capture unit 21 of the magnetic resonance device 9 by means of a navigator measurement. In method step 2, the capture of the first position data may also be a function of information from the second position data.

Method step 3 characterizes the capture by the capture unit 21 of the magnetic resonance device 9 of second position data by means of external markers applied to the examination object. In method step 3, alignment of the second position data captured using external markers can additionally be effected by means of the first position data of the navigator measurement and/or a consistency check. Furthermore, the capture of the second position data can be calibrated by means of the first position data of the navigator measurement.

In method step 4, the capture of at least one magnetic resonance image data set is effected by the capture unit 21 of the magnetic resonance device 9 and in method step 5, the adjustment of recording parameters and/or reconstruction parameters for recording and/or reconstruction of the at least one magnetic resonance image data set is effected as a function of the first and/or the second position data by the processing unit 28 of the magnetic resonance device 9. The adjustment of recording parameters and/or reconstruction parameters may also include a readjustment of gradient parameters $G_x$, $G_y$, $G_z$.

Method step 6 characterizes the end of the adjustment.

Embodiments of the invention relate to a method, a computer program product and a computer-readable storage medium for adjustment by a magnetic resonance device of at least one magnetic resonance image data set of a movable examination object. After capturing two different types of position data for determination of the position of the examination object using navigator measurements, and with the help of external markers, recording parameters and/or reconstruction parameters for recording and/or reconstruction of the at least one magnetic resonance image data set are adjusted as a function of the first and/or the second position data.

The invention claimed is:

1. A method for adjustment by a magnetic resonance device of an at least one magnetic resonance image data set of a movable examination object, comprising the steps:
   capturing a first position data of the movable examination object by means of a navigator measurement;
   capturing a second position data by means of external markers physically applied to an outside of the movable examination object;
   capturing, by the magnetic resonance device, the at least one magnetic resonance image data set; and
      adjusting, by the processing unit, a plurality of recording parameters and/or reconstruction parameters for recording and/or reconstruction of the at least one magnetic resonance image data set and gradient parameters, as a function of the first position data and/or the second position data to correct for movement artifacts; and
      displaying, the at least one magnetic resonance image data set.

2. The method as claimed in claim 1, wherein the second position data captured using external markers is aligned by means of the first position data of the navigator measurement and/or checked for consistency.

3. The method as claimed in claim 1, wherein capturing the first position data is a function of information from the second position data.

4. The method as claimed in claim 1, wherein capturing the second position data is calibrated by means of the first position data of the navigator measurement.

5. The method as claimed in claim 1, wherein adjusting the plurality of recording parameters and/or reconstruction parameters comprises a readjustment of gradient parameters $(G_x, G_y, G_z)$.

6. A magnetic resonance device for a correction of image data sets of a movable examination object, wherein the magnetic resonance device includes a capture unit, a processing unit, a control device and an output unit, and is configured to perform the following steps:
   capturing, by the capture unit, a first position data of the movable examination object by means of a navigator measurement;
   capturing, by the capture unit, a second position data by means of external markers physically applied to an outside of the movable examination object;
   capturing, by the capture unit, an at least one magnetic resonance image data set; and
   adjusting, by the processing unit, a plurality of recording parameters and/or reconstruction parameters for recording and/or reconstruction of the at least one magnetic resonance image data set and gradient parameters as a function of the first position data and/or the second position data to correct for movement artifacts.

7. A computer program product which comprises a program loaded directly into a memory of a programmable control device of a magnetic resonance device, with a program means to execute all steps of the method as claimed in claim 1, when the program is executed in the control unit of the magnetic resonance device.

8. An electronically readable data carrier with electronically readable control information stored thereon, which is configured to perform the method as claimed in claim 1 when the data carrier is used in a control unit of the magnetic resonance device.

* * * * *